United States Patent
Pettigrew et al.

(10) Patent No.: US 9,257,926 B2
(45) Date of Patent: Feb. 9, 2016

(54) METHOD AND CONTROL SYSTEM FOR CONTROLLING MOBILITY VEHICLES

(75) Inventors: Warren Gordon Pettigrew, Christchurch (NZ); Ian Palmer, Christchurch (NZ)

(73) Assignee: Dynamic Controls, Riccarton, Christchurch (NZ)

( * ) Notice: Subject to any disclaimer, the term of this patent is extended or adjusted under 35 U.S.C. 154(b) by 215 days.

(21) Appl. No.: 13/574,406

(22) PCT Filed: Sep. 15, 2011

(86) PCT No.: PCT/NZ2011/000191
§ 371 (c)(1),
(2), (4) Date: Oct. 22, 2012

(87) PCT Pub. No.: WO2012/044182
PCT Pub. Date: Apr. 5, 2012

(65) Prior Publication Data
US 2013/0035816 A1   Feb. 7, 2013

(30) Foreign Application Priority Data
Sep. 28, 2010 (NZ) ........................................ 588233

(51) Int. Cl.
*G01R 31/34* (2006.01)
*B60L 3/00* (2006.01)
*H02P 7/29* (2006.01)

(52) U.S. Cl.
CPC ................. *H02P 7/29* (2013.01); *B60L 3/0061* (2013.01); *B60L 2200/20* (2013.01); *B60L 2200/22* (2013.01); *B60L 2200/34* (2013.01); *G01R 31/343* (2013.01); *Y02T 10/7258* (2013.01)

(58) Field of Classification Search
CPC . G01R 31/343; H02P 7/2815; H02P 21/0092; H02P 21/146; B60L 2240/429; B60L 11/1805
USPC ............................................................ 701/22
See application file for complete search history.

(56) References Cited

U.S. PATENT DOCUMENTS

| | | | |
|---|---|---|---|
| 4,266,168 A | 5/1981 | Andersen | |
| 5,793,175 A | 8/1998 | Journey | |

(Continued)

FOREIGN PATENT DOCUMENTS

| | | |
|---|---|---|
| DE | 39 19 108 | 12/1990 |
| DE | 198 58 584 | 6/2000 |
| DE | 102 54 392 | 5/2004 |

OTHER PUBLICATIONS

International Search Report for International Application No. PCT/NZ2011/000191 mailed Dec. 23, 2011.

(Continued)

*Primary Examiner* — John R Olszewski
*Assistant Examiner* — Todd Melton
(74) *Attorney, Agent, or Firm* — Merchant & Gould P.C.

(57) ABSTRACT

A method of controlling at least one motor in a motorized mobility vehicle, wherein the motor is part of a drive circuit for mobilizing the mobility vehicle, the method comprising the steps of: utilizing a stored profile of a motor performance parameter to develop a compensation term for controlling the motor, wherein the stored profile is of a resistance based variable associated with the motor as a function of a further variable and dynamically updating the compensation term when the mobility vehicle is in use.

71 Claims, 10 Drawing Sheets

(56) References Cited

U.S. PATENT DOCUMENTS

| | | |
|---|---|---|
| 5,961,561 A | 10/1999 | Wakefield, II |
| 6,989,642 B2 | 1/2006 | Wakefield, II et al. |
| 7,026,776 B1 | 4/2006 | Walters |
| 7,090,613 B2 | 8/2006 | Heap et al. |
| 7,148,638 B2 | 12/2006 | Wakefield, II et al. |
| 7,265,954 B2 * | 9/2007 | Hikawa et al. ............... 361/29 |
| 7,746,027 B2 * | 6/2010 | Imamura et al. ............. 320/104 |
| 7,898,203 B2 * | 3/2011 | Davis et al. ................. 318/490 |
| 8,127,875 B2 * | 3/2012 | Mattes et al. ............... 180/65.8 |
| 2003/0117096 A1 | 6/2003 | Gagnon et al. |
| 2004/0021437 A1 | 2/2004 | Maslov et al. |
| 2005/0071095 A1 | 3/2005 | El-Ibiary |
| 2006/0180368 A1 | 8/2006 | Hsieh et al. |
| 2007/0132446 A1 | 6/2007 | Kleinau et al. |
| 2008/0071436 A1 | 3/2008 | Dube et al. |
| 2010/0007299 A1 | 1/2010 | Davis et al. |

OTHER PUBLICATIONS

Tong et al. "Estimating the Residual Travel Distance of an Electrical Scooter." *IEEE*. 2009. pp. 1348-1352.

\* cited by examiner

Applied Voltage = $V = I \times R_{motor} + e$

Therefore $R = (V - e)/I$

Where $I$ = motor current
$e$ = Back emf
$R_{motor}$ = motor resistance

DC MOTOR EQUIVALENT CIRCUIT

METHOD AND CONTROL SYSTEM FOR CONTROLLING MOBILITY VEHICLES

This application is a National Stage Application of PCT/NZ2011/000191, filed 15 Sep. 2011, which claims benefit of Serial No. 588233, filed 28 Sep. 2010 in New Zealand and which applications are incorporated herein by reference. To the extent appropriate, a claim of priority is made to each of the above disclosed applications.

FIELD OF THE INVENTION

The present invention relates to an improved method and control system for controlling mobility vehicles. In particular, the present invention relates to an improved method and control system for controlling at least one electric motor of a mobility vehicle using motor profiles.

BACKGROUND

It is important that motor drive systems in mobility vehicles are carefully controlled to avoid placing the user of the vehicles in danger and/or harming others around them, or at the very least to provide a stable and reliable driving experience. The mobility vehicles may be, for example, motorized wheelchairs or scooters that assist users in being mobile. These types of mobility vehicles may be termed "medical mobility vehicles" as they are generally used for persons who have a medical condition that reduces their ability to be self mobilised and so require a vehicle for them to move around.

The motor drive systems for this type of vehicle incorporate various different forms of motor control which aim to provide the user with reliable and safe operation of the vehicle. Improved control is particularly important for medical mobility vehicles due the reduced capability of users of these vehicles. In particular, improved speed control is desirable.

One problem associated with motor drive systems that incorporate permanent magnet or shunt wound motors is that changes in the armature resistance of the motors can cause changes in the speed of the mobility vehicle when the loading of the motor varies.

One form of control system used in mobility vehicles to compensate for the armature resistance effect is known as IXR load compensation. This traditional approach measures the load induced current of the drive motors and applies an extra voltage to compensate for the voltage lost across the motor armature resistance. This compensation method works throughout all four control quadrants of the mobility vehicle so that not only will the motor hold speed during positive loading it will also hold speed during negative loading or braking. The four control quadrants are known as forward drive, reverse braking, forward braking and reverse drive.

However, because of resistance effects, these motors may operate more slowly with imposed positive loading. Therefore, where tight speed regulation is important, as with drive systems for power wheelchairs and mobility scooters, accurate means of compensating for load induced speed changes is desirable. One such area where this is particularly relevant is that of medical mobility vehicles (such as power wheelchairs, for example) that use differential steering via two traction motors where steer precision is directly dependant on the speed holding ability of the motors.

The load compensation on these motors is not currently performed accurately because motor resistance is a variable that is a complex function of current, temperature, speed and time. If these inaccuracies lead to over-compensation, harsh and unstable driving characteristics may result. If under-compensated, driving precision may be compromised. Therefore, because of risks associated with over-compensation, it is generally required that under-compensation is performed.

Further, mobility vehicles traditionally need programming tools to adjust the level of compensation. For example, the level of compensation is adjusted only when the vehicle is taken in for a service.

One method of measuring motor resistance at stall is described in US Patent application US 2010/0007299. However, this system requires the motor not to be turning when the measurement is taken, which can result in inaccurate and varying measurements of resistance due to the large number of different positions in which the brush within the motor may stop. Further, this single resistance measurement remains fixed when the mobility vehicle is in use.

Another known method of compensating for motor resistance is described in U.S. Pat. No. 4,266,168. This describes a method of measuring the back EMF of a motor during use of the motor to generate a feedback signal that accounts for the motor's resistance. However, once measured, the feedback signal is only updated periodically resulting in a fixed feedback resistance value being applied between updates.

A further known problem with motor control in mobility vehicles is that of monitoring and detecting potential scenarios associated with a motor before they occur and reducing the potential for these scenarios to occur. In general, known systems that attempt to detect specific scenarios are complex and expensive. These scenarios may include, for example, potential damage to the motor, loss of performance, service requirements, etc.

For example, in a DC brush motor, problems may occur as the motor gets older when the brushes on the commutator start to wear. The brush damage can cause an increase in motor electrical resistance, making the motor more vulnerable to stalling and possible overheating.

Service scheduling of mobility vehicles is generally done by way of allocating a fixed period in between services. This can lead to increased damage to the motor components if wear and tear on the motor occurs rapidly in between services. Further, as wear and tear occurs in between services, the operation of the mobility vehicle may become erratic and unsafe.

Monitoring of motor temperature to prevent damage is generally performed by applying temperature sensors and sensing circuitry. However, this added circuitry and the extra components required increases cost and complexity.

The background discussion (including any potential prior art) is not to be taken as an admission of the common general knowledge.

An object of the present invention is to provide an improved method and control system for mitigating the effects of motor characteristics on the operation of a mobility vehicle.

A further object of the present invention is to provide an improved method and control system for updating a motor characteristic profile.

A further object of the present invention is to provide a method of detecting the likelihood of potential scenarios with a motor and providing an indication of these scenarios.

A further object of the present invention is to provide an improved method and system for controlling power applied to a motor dependent on one or more of the motor's performance characteristics.

A further object of the present invention is to provide an improved method and system for monitoring a motor based on one or more of the motor's performance characteristics.

Each object is to be read disjunctively with the object of at least providing the public with a useful choice.

The present invention aims to overcome, or at least alleviate, some or all of the afore-mentioned problems.

SUMMARY OF THE INVENTION

It is acknowledged that the terms "comprise", "comprises" and "comprising" may, under varying jurisdictions, be attributed with either an exclusive or an inclusive meaning. For the purpose of this specification, and unless otherwise noted, these terms are intended to have an inclusive meaning—i.e. they will be taken to mean an inclusion of the listed components which the use directly references, and possibly also of other non-specified components or elements.

According to one aspect, the present invention provides a method of controlling at least one motor in a motorised mobility vehicle, wherein the motor is part of a drive circuit for mobilising the mobility vehicle, the method comprising the steps of: utilising a stored profile of a motor performance parameter to develop a compensation term for controlling the motor, wherein the stored profile is of a resistance based variable associated with the motor as a function of a further variable and dynamically updating the compensation term when the mobility vehicle is in use.

According to yet a further aspect, the present invention provides a control system in a motorised mobility vehicle, the control system arranged to control at least one motor wherein the motor is part of a drive circuit for mobilising the mobility vehicle, the control system comprising: a compensation term development module arranged to utilise a stored profile of a motor performance parameter to develop a compensation term for controlling the motor, wherein the stored profile is of a resistance based variable associated with the motor as a function of a further variable and dynamically update the compensation term when the mobility vehicle is in use.

According to yet a further aspect, the present invention provides a method of controlling at least one motor in a motorised mobility, vehicle, wherein the motor is part of a drive circuit for mobilising the mobility vehicle, the method comprising the steps of: developing at least one motor performance parameter of the motor, developing a resistance based profile of the motor based on the developed motor performance parameter, storing the developed profile, and controlling the motor based on the stored profile.

According to yet a further aspect, the present invention provides a control system in a motorised mobility vehicle, the control system arranged to control at least one motor, wherein the motor is part of a drive circuit for mobilising the mobility vehicle, the control system comprising a motor performance parameter development module arranged to develop at least one motor performance parameter of the motor, a profile development module arranged to develop a resistance based profile of the motor based on the developed motor performance parameter, a storage module arranged to store the developed profile, and a control module arranged to control the motor based on the stored profile.

According to yet a further aspect, the present invention provides a method of monitoring a resistance based profile of a motor, wherein the motor is part of a drive circuit for mobilising a mobility vehicle, the method comprising the steps of: monitoring the resistance based profile, predicting an operation scenario based on the monitoring step and providing an output based on the predicted operation scenario.

a system for monitoring a resistance based profile of a motor, wherein the motor is part of a drive circuit for mobilising a mobility vehicle, the system comprising: a profile monitoring module arranged to monitor the resistance based profile, a scenario prediction module arranged to predict an operation scenario based on the monitoring step and an output module arranged to provide an output based on the predicted operation scenario.

According to yet a further aspect, the present invention provides a method of monitoring a motor suitable for use in a drive circuit of a motorised mobility vehicle, the method comprising the steps of: developing at least one motor performance parameter associated with a motor being monitored, developing a resistance based profile based on the developed motor performance parameter, storing the developed profile, and monitoring the motor based on the stored profile.

According to yet a further aspect, the present invention provides a motor performance monitoring system arranged to monitor a motor suitable for use in a drive circuit of a motorised mobility vehicle, the system comprising: a profile development logic module arranged to develop at least one motor performance parameter associated with a motor being monitored, and develop a resistance based profile based on the developed motor performance parameter, a storage module arranged to store the developed profile, and a monitoring module arranged to monitor the motor based on the stored profile.

BRIEF DESCRIPTION OF THE DRAWINGS

Embodiments of the present invention will now be described, by way of example only, with reference to the accompanying drawings, in which.

DETAILED DESCRIPTION OF THE INVENTION

First Embodiment

The following embodiment describes a control system and method of controlling a mobility vehicle. The mobility vehicle may be, for example, a motorised wheelchair or motorised scooter, which may collectively be known as a medical mobility vehicle as they are generally used for persons who have a medical condition that reduces their ability to be self mobilised and so require a vehicle for them to move around.

According to this embodiment, the mobility vehicle includes a drive system that has two DC drive motors for mobilising the vehicle. It will be understood that, as an alternative, the mobility vehicle may have one or more drive motors.

According to this embodiment, the DC drive motors are DC brush motors or DC brushless motors. It will be understood that, as an alternative, the DC drive motors may be any suitable type of permanent magnet or shunt wound motor where load changes result in speed changes due to armature resistance, and where the back EMF (electromotive force) is directly proportional to the rotational speed of the motor. As a further alternative, the mobility vehicle may use a combination of different drive motors.

According to this embodiment, a method and associated control system is described that develops a compensation term used to control the operation of the two drive motors forming the differential drive circuit of the mobility vehicle.

Figure 1:
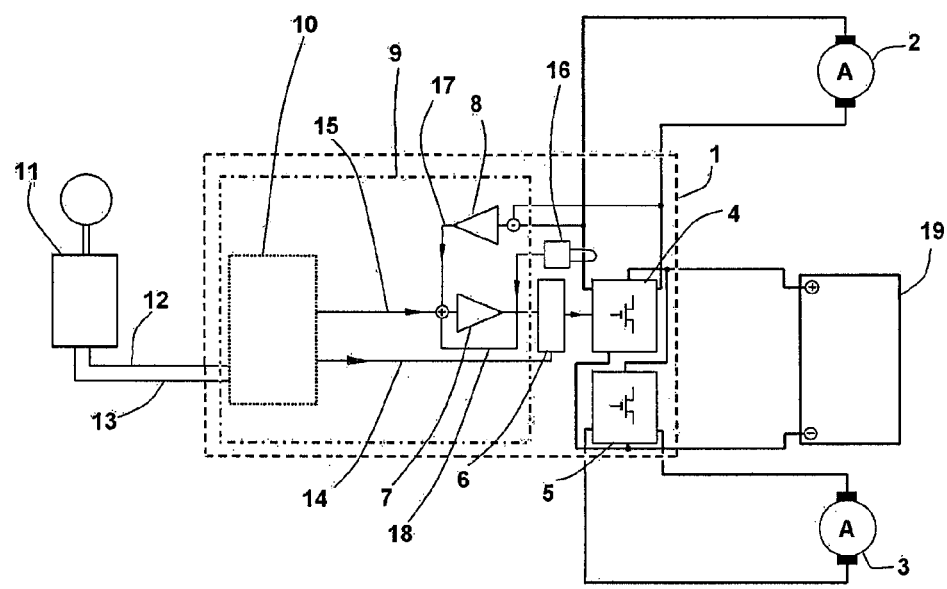
FIG. 1 shows system conceptual block diagram according to an embodiment of the present invention.

FIG. 1 shows a system conceptual block diagram of various modules and functions used according to this embodiment. A controller 1 includes all the control components forming the control system of the mobility vehicle.

The modules and functions shown in FIG. 1 and described below relate to a single motor 2. However, it will be understood that these modules and functions may be duplicated for each of the motors (such as motor 3) in the mobility vehicle drive system.

A first motor 2 is connected to a first motor bridge 4. A second motor bridge 5 is connected to the second motor 3. A bridge driver 6 is used to drive the first motor bridge 4.

Forming part of a microcontroller 9 are an error amplifier function 7, a differential amplifier function 8 and a steering and speed processor 10. It will be understood that the error amplifier function and amplifier function may also be implemented using any suitable module, software and/or circuit arrangement.

The steering and speed processor 10 receives input signals from a joystick 11 in the form of a steering signal 12 and a speed signal 13. The steering signal relates to the direction in which the mobility vehicle has been instructed to travel by the user. For example, by pushing the joystick to the left, the right side motor (e.g. motor 2) and left side motor (e.g. motor 3) are sent drive signals which cause the right side motor to turn faster than the left side motor. This then causes the mobility vehicle to turn left.

The speed signal relates to the speed the mobility vehicle has been instructed to travel by the user. For example, by pushing the joystick in a forward position, the speed of both motors is increased.

The steering and speed processor output includes an inhibit signal 14, which is fed to the bridge driver 6. This inhibit signal 14 causes the power to the motors (2, 3) via the bridges (4, 5) to be reduced. The steering and speed processor output also includes a motor speed command signal 15 for controlling the first motor 2 via the error amplifier 7, the bridge driver 6 and the bridge 4.

The differential amplifier 8 develops a difference signal based on the terminal voltages of the motor 2. The error amplifier 7 develops a control signal based on the motor speed command signal 15, the output of the difference amplifier 8 and the current provided by a current sensor 16, which detects the current being applied to the motor 2.

It will be understood that, as an alternative, any other suitable method of developing, determining or measuring the current may be utilised.

Power is provided to the motors and control system by way of a battery 19.

Although not shown in FIG. 1, it will be understood that further components are used to control the second motor 3 in a similar manner to the method used to control the first motor 2. That is, the circuit includes a second bridge driver, error amplifier, difference amplifier and current sensor to control the operation of the second motor 3 via the second bridge 5. Further, it will be understood that the steering speed processor 10 includes a further motor speed control signal and further inhibit signal for controlling the second motor via the second bridge 5.

Figure 2:
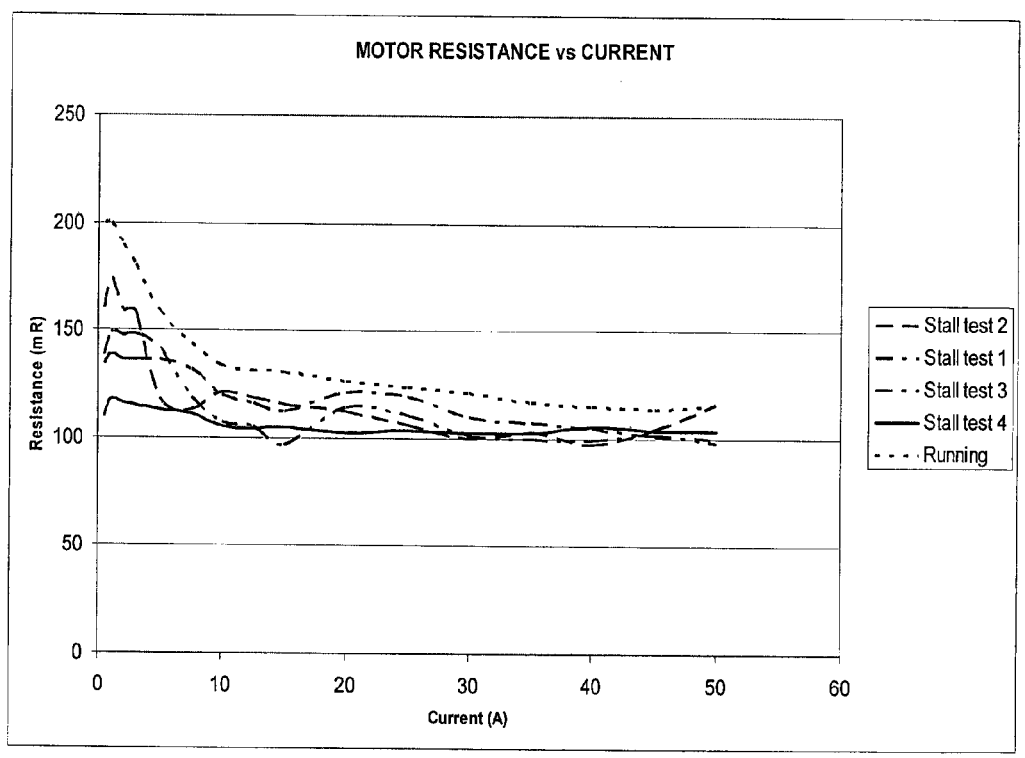
FIG. 2 shows a first parameter plot.

As explained above, in this embodiment the DC motors may be DC brush motors. Brush resistance contributes significantly to motor resistance. Additionally the contact resistance of the brush onto the commutator has a high dependency on current, temperature and wiping speed. If the wiping speed is zero, the resistance varies greatly with the degree of contact at the time of measurement, as depicted in FIG. 2.

Overlaying the issue of wiping speed, it can also be seen that the motor resistance is a complex function of current. This arises from the fact that the brushes make contact with the metal commutator at minute points. The current density at these points is very high which causes the brushes to heat up locally. Carbon brushes have a negative temperature coefficient of resistance so the resistance effectively drops with increasing current. It is not uncommon for the resistance to vary by a factor of 3:1. This means that motor compensation can have a 3:1 error in compensation if the resistance is not taking account of properly.

It has also been determined that, provided the wiping speed of the brush motor is greater than a few millimeters per second, the resistance becomes stable. Therefore, it is preferable to measure the resistance of the motor when the motor is running.

Figure 3:
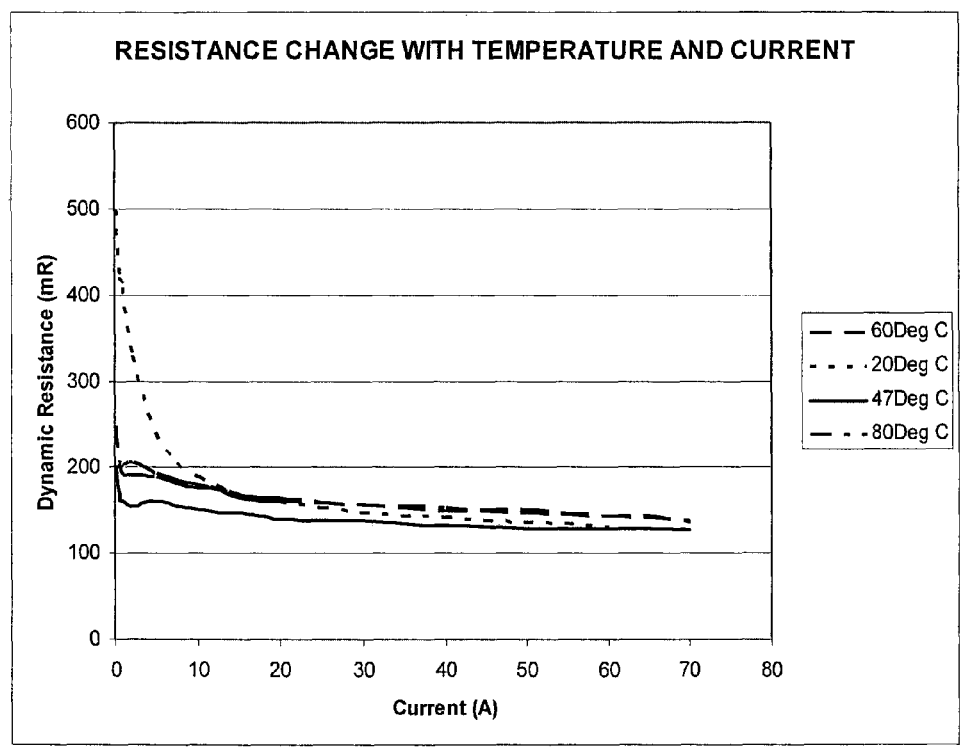
FIG. 3 shows a second parameter plot.

Another variable is that of overall motor temperature. This also has a complex and dramatic effect on motor resistance as depicted in FIG. 3.

Figure 4:
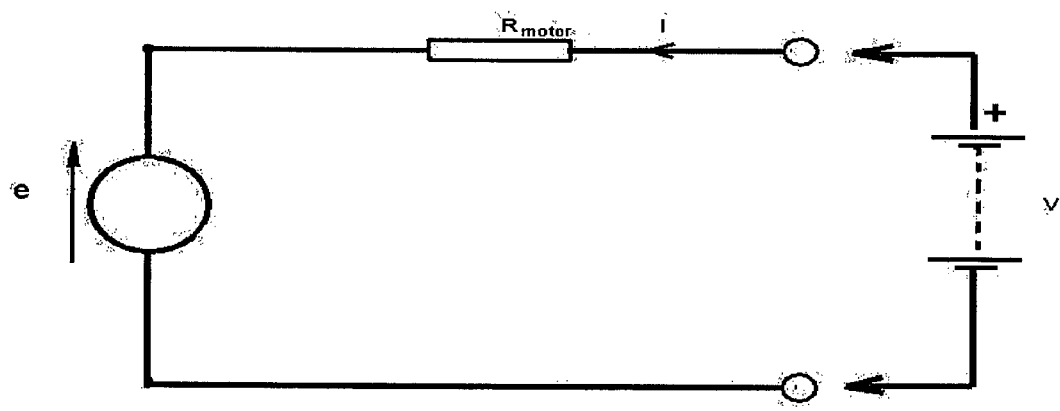
FIG. 4 shows a DC motor equivalent circuit.

As a first step, a performance parameter profile is created. According to this embodiment, the performance parameter is a resistance-based parameter. The profile is created by measuring the terminal voltage and back EMF of the motor at different load currents. Therefore, using the relationship of:

$$R=(V-e)/I$$

where R=electrical resistance of the motor, V=terminal voltage of the motor, e=back EMF of the motor and I=load current, a value for R can be determined at various load currents. The calculated R value is the momentary motor resistance for the conditions of current, speed and temperature at the time of the sample being taken. A simplified DC motor equivalent circuit is shown in FIG. 4 to explain how R=(V−e)/I.

It will be understood that it is not necessary to use the actual resistance value R directly for the profile and that any related resistance-based variable or calculation may be used that is associated with R. For example, a ratio of R×I (i.e. a voltage value) or (V−e)/R (a current value) may be stored as an alternative, where the values are all based on the measured electrical resistance of the motor.

According to this embodiment, the determined R values for specific current values are stored in a table and values of R in between the measured current values are interpolated and stored. That is, a memory module is used to store cross referenced values of measured and interpolated R against the measured and interpolated current values.

Alternatively, it will be understood that a best fit equation may be determined based on the measured R values. That is, analysis of the R values may be performed by a processing module to determine if the change in R is linear, exponential or varies in some other way. This determination may be made for different bands of current values so that multiple equations may be produced for different bands of operating parameters of the motor. Therefore, for measured current values it becomes possible to apply the equation or equations to determine the associated R value.

It will be understood that the R values may be stored or in any other suitable format which enables a profile to be stored and its associated values to be retrieved.

Various components shown in FIG. 1 are used to develop the motor profile. The current sensor 16, or current sensing function, is used to develop the load current value I. The difference amplifier function 8 is used to develop the terminal voltage V, and the back EMF voltage e.

Figure 5A:
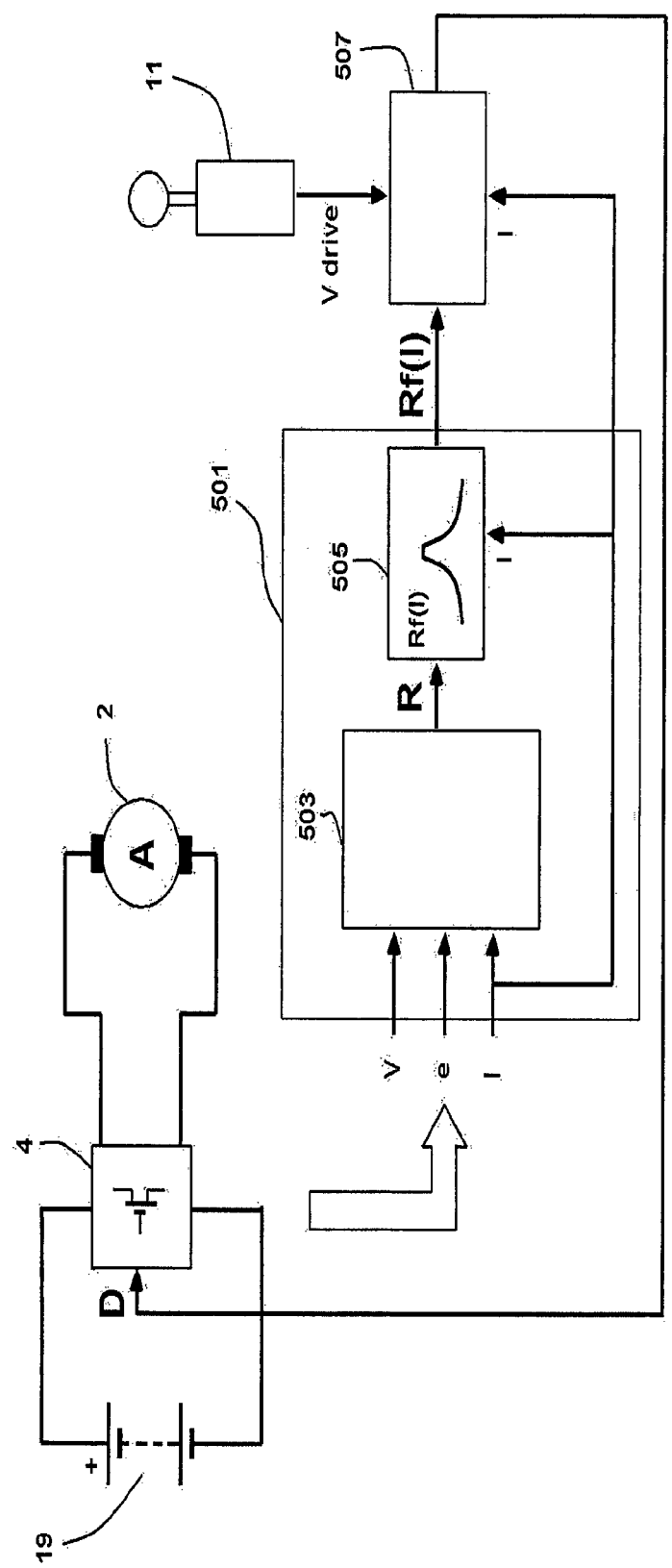
FIGS. 5A and 5B show block functional diagrams according to an embodiment of the present invention.

FIG. 5A shows a block functional diagram of how the V, I and e values are used to develop the profile. The V, I and e values are provided to a profile development module 501. The profile development module includes a profile development logic module 503 and a storage module 505. The V, I and e values are input to the logic module 503 to determine the R value based on the equation $R=(V-e)/I$.

The logic module 503 outputs the R value to the storage module 505, where the R value is stored for different I values. For example, the values for R for varying I values are stored as a look up table.

Figure 5B:
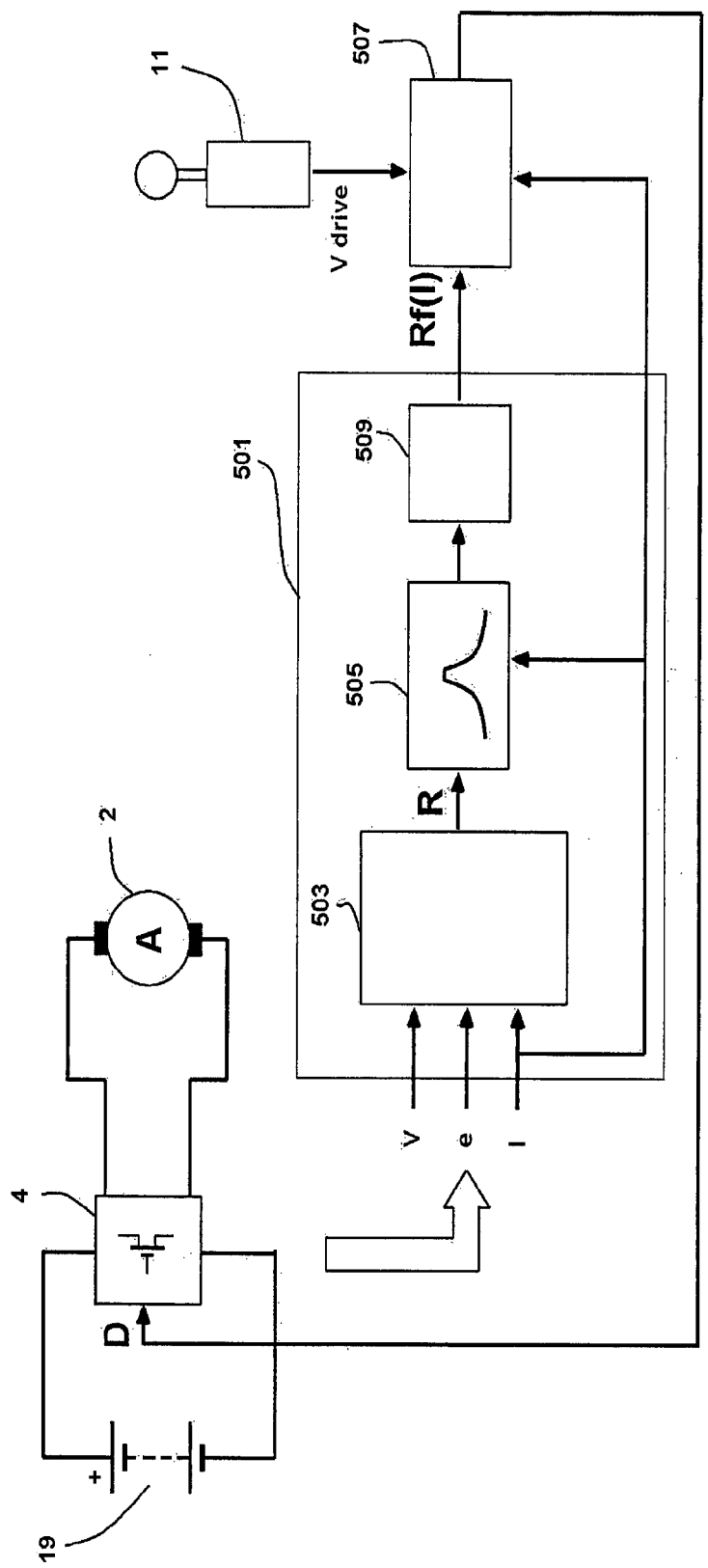

FIG. 5B shows an alternative block functional diagram of how the V, I and e values may be used to develop the profile. The system includes the same components as described above in relation to FIG. 5A. In addition, the profile development module 501 includes an equation development module 509 that reads the stored R values and associated I values to develop a best fit equation.

Figure 6:
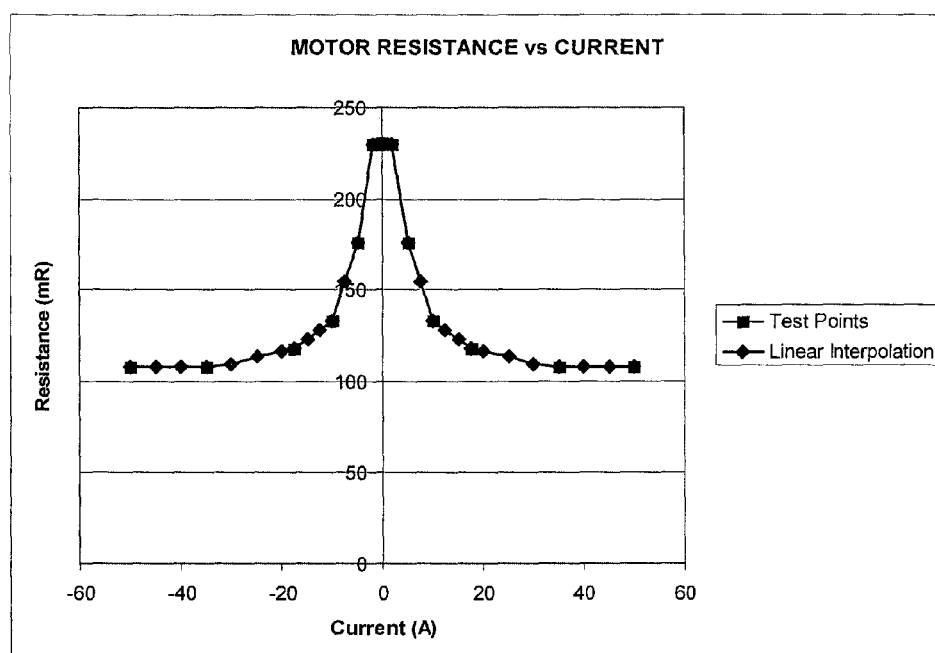
FIG. 6 shows a performance parameter profile according to an embodiment of the present invention.

FIG. 6 shows an example of a resistance based profile of electrical resistance against load current for a motor.

According to this embodiment, only forward driving currents are recorded and reverse currents are developed by mirroring the forward current values. Alternatively, a full range of forward and reverse current values may be developed for the profile.

Generally the lower part of the working current range of a motor has greater variability with current and so is generally considered more important to plot. Therefore, a greater resolution of load current values may be recorded in the lower portion of the working current range to provide a more accurate profile.

Further, resistance measurements in braking can be assumed to be equal to those in drive. Therefore, the resistance map for quadrant 1 (driving forward) in this embodiment is considered the same as the other 3 quadrants. Alternatively, the profile may be developed by taking measurements of R and I in all 4 operating quadrants of the motor.

According to this embodiment, a profile is created for each motor. However, it will be understood that, as an alternative, a single profile may be created from a single motor and used for all motors of a similar construction.

To calculate R, the load current is developed as follows. The load current is sampled using the load current sensor 16. It will be understood that, as an alternative, the load current may be determined using other suitable methods.

To calculate R, the terminal voltage is developed as follows. According to this embodiment, the terminal voltage is a PWM (Pulse Width Modulated) waveform. The terminal voltage reading is therefore established by filtering or by calculation after measuring the mean peak voltage and the PWM ratio.

To calculate R, the back EMF is developed as follows. The drive to the motor is momentarily turned off to let the motor free-wheel for a few milliseconds. This allows the back EMF to be established. As soon as the motor back EMF is established, it is sampled and recorded. Just prior to the back EMF being sampled, the motor current and terminal voltage are sampled as described above.

Initially, the resistance based profile may be loaded into the controllers manually during product assembly or commissioning.

An automated process is provided that updates the table repeatedly to accommodate for resistance changes due to motor heating and aging. This updating process may be performed automatically during routine driving, and preferably without the user being made aware that the profile update is happening. By doing this, each individual motor can be separately compensated so that motor to motor variations are seamlessly accommodated throughout the life of the motor.

When the control system is turned off (generally for a few milliseconds) to sample the back EMF an audible click may be heard or a small torque pulse felt. In order to minimize these effects it is preferable that sampling is not done under conditions of very high loading and it is preferable that the motor drive is turned off for a period just long enough to establish a stable back EMF voltage. This period may depend on actual operating conditions, or be based on a predetermined time period or a stored algorithm.

In order to minimize torque pulse effects during the off period, it may be beneficial to recover the lost current with a strong but measured current pulse immediately after the off period.

Alternatively, the profile may be updated during servicing of the vehicle.

Referring back to FIG. 5A the block functional diagram shows how the compensation term is developed.

A compensation term module 507 retrieves Rf(I) values (i.e. R as a function of current) from the storage module 505 based on the monitored I value being received and outputs the relevant Rf(I) value as a profile term. The profile term (R) is fed to a multiplier along with the monitored I value within the compensation term module to create a compensation term IXR. The compensation term IXR is added to the Voltage drive signal (V drive) to provide a drive signal to the switching bridge 4 to apply motor voltage in proportion to V drive and to apply additional voltage to compensate for the loss of voltage across the resistance of the motor.

Alternatively, as shown in FIG. 5B the compensation term may be developed based on the best fit equation.

The profile term R, and so the compensation term IXR, are dynamically updated based on the developed load current value (I). It is preferable that the profile term and compensation term are continuously updated without providing a substantial break in between updates.

As the motor current commonly changes by orders of magnitude in a millisecond time-frame, according to this embodiment the compensation term is dynamically applied in a millisecond time frame in order to continuously and accurately compensate for motor resistance. However, it will be understood that different time frames for applying the compensation term dynamically may be used.

It is preferred that the load current is monitored in real time and that the compensation term is developed in real time.

It is also preferred that the stored profile is shaped by current, and that the compensation term is shaped by the stored profile.

As an alternative, the stored profile may be shaped by speed.

With any feedback control system, some form of stabilization is necessary generally in the form of a proportional-integral term. The closer the system becomes to 100% compensated, the more critical stabilization becomes. Therefore, according to this embodiment, the compensation term includes both a proportional and integral profile term. However, it will be understood that, as an alternative, the compensation term may only include a proportional term, or may include a proportional, integral and derivative term.

Therefore, the compensation term generated using the above described circuit shown in FIG. 1 is based on one or more performance parameters of the motor.

Optionally different profiles may be developed for the motor based on the speed of operation. Therefore, the control system may monitor the speed of the mobility vehicle and use this extra variable to determine which of the stored resistance based profiles are to be used. This therefore enables the IXR compensation term to be optimized for different driving speeds.

According to this embodiment, the motor resistance is 100% compensated so that there is no change of speed with loading. However, it will be understood that, in some circumstances, it may be beneficial to apply less than 100% compensation to assure smoothness or give some "feel" to the drive of the mobility vehicle. For example when approaching an incline, a slight reduction in speed due to the reduced compensation provides an expected driving experience, which re-assures the operator of the vehicle.

Optionally, changes in resistance beyond the expected norm may be recorded by the system. For example, the expected norms could be programmable numbers entered by the chair manufacturer. Changes beyond the expected norm may indicate that a service, such as a brush change, is due or that the motor has become over-heated. A warning may be generated by the system to alert the operator of the vehicle. Alternatively, an automatic power limiting routine may be instigated by the controller to limit possible motor damage. Further, a log of dynamic motor resistance may be stored in the controller for downloading during service to enable the service entity to evaluate the state of the motors. This information would be valuable for service personnel for fault-finding and for predicting motor service such as brush changing.

As shown in FIG. 3, the electrical resistance of the motor varies with respect to the temperature of the motor. Therefore, using this relationship it is possible to determine a range of resistance values that are associated with a preferred operating temperature. By dynamically monitoring the resistance value of the motor, a percentage increase in the resistance value may be monitored, stored or recorded.

Where the percentage increase has exceeded a predetermined threshold value, a warning signal may be developed. For example, the warning signal may be a visible or audible signal to make the user aware that the motor is overheating and so they should slow the vehicle down. Also, the warning signal may be generated and stored so that service engineers may be made aware of the over temperature warnings when the vehicle is being serviced.

Further, where the percentage increase has exceeded a predetermined threshold value, the power being supplied to the motor may be limited to automatically reduce the temperature of the motor. For example, the power to the motor may be limited by adjusting a limiting or compensation term that is applied to the control system to control the operation of the motor.

Further, trends in the R values being monitored may be recorded or stored. These trend values may then be reviewed by the user to predict when a service schedule is due. Alternatively, the system may automatically predict when a service schedule is due and provide a visible or audible warning to the user to that effect. For example, if the system detects that the resistance value has increased by 20% over a predefined period, such as a month for example, the system may issue a warning that the mobility vehicle will require a service within a month. As a further example, if the system detects that the resistance value has increased by 30% over a predefined period, such as a month for example, the system may issue a warning that the mobility vehicle should have a service immediately.

Also, by monitoring the electrical resistance values, if the system detects that the resistance value has exceeded a predefined threshold value, a warning signal may be generated. For example, the warning signal may be a visible or audible signal to make the user aware that a fault has developed and requires attention.

Figure 7:
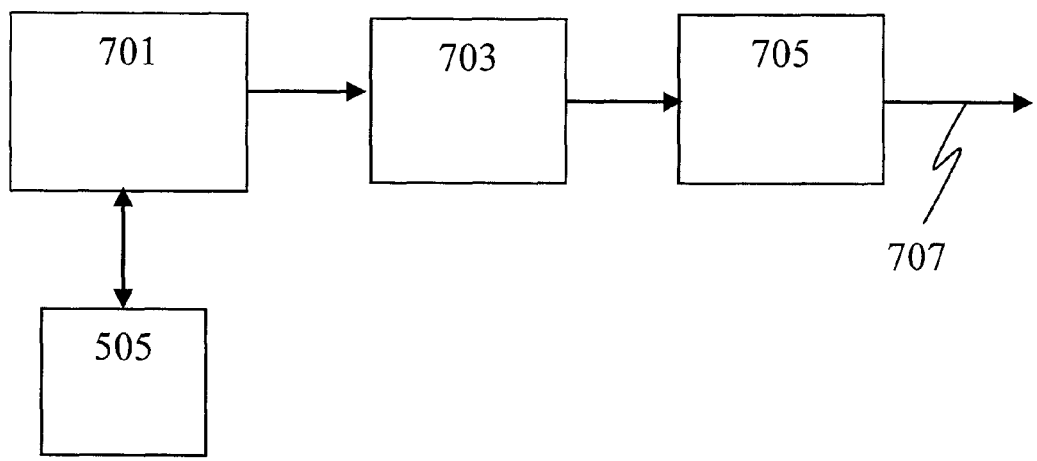
FIG. 7 shows a functional block diagram according to an embodiment of the present invention.

FIG. 7 shows a functional block diagram of components that may be used to detect operational scenarios associated with the resistance based profile of the motor.

The resistance based profile stored in the storage module 505 is monitored by a profile monitoring module 701. A scenario prediction module 703 is arranged to predict an operation scenario based on the output received from the profile monitoring module 701. An output module 705 is arranged to provide an output 707 based on the predicted operation scenario, where the operation scenarios are as described above in relation to the resistance based performance parameters of the motor.

Figure 8A:
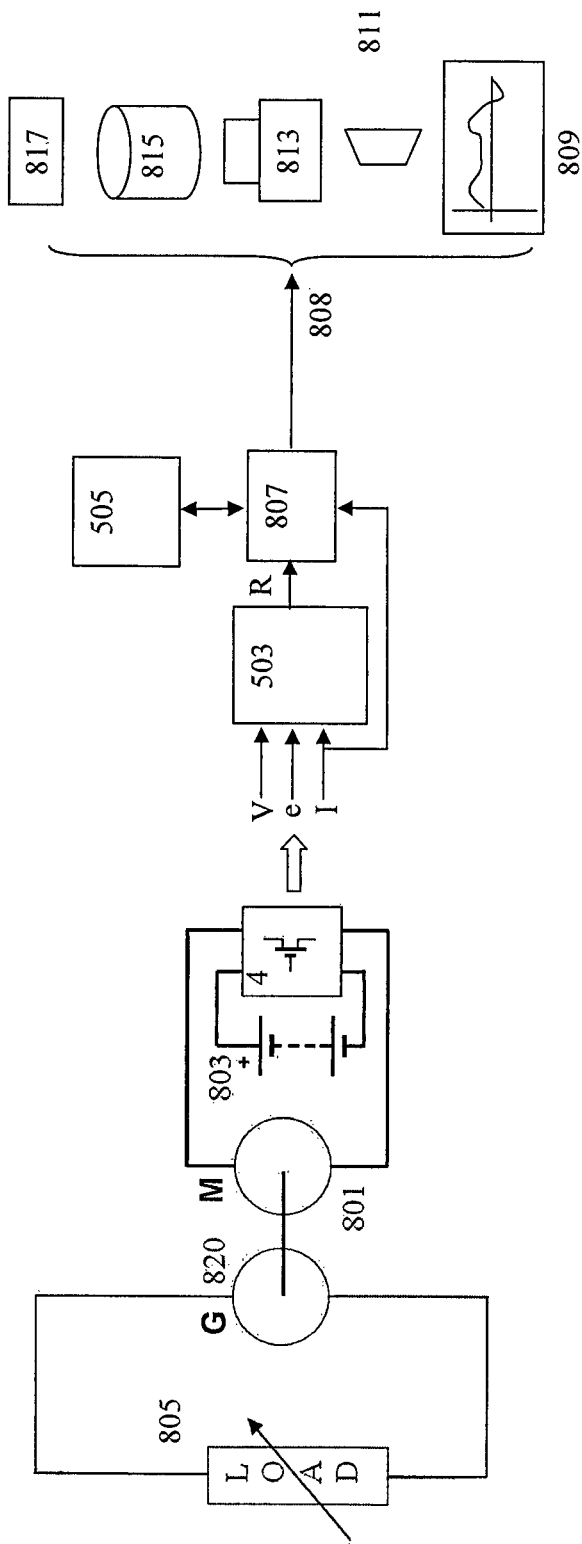
FIGS. 8A and 8B show block functional diagrams according to an embodiment of the present invention.
Figure 8B:
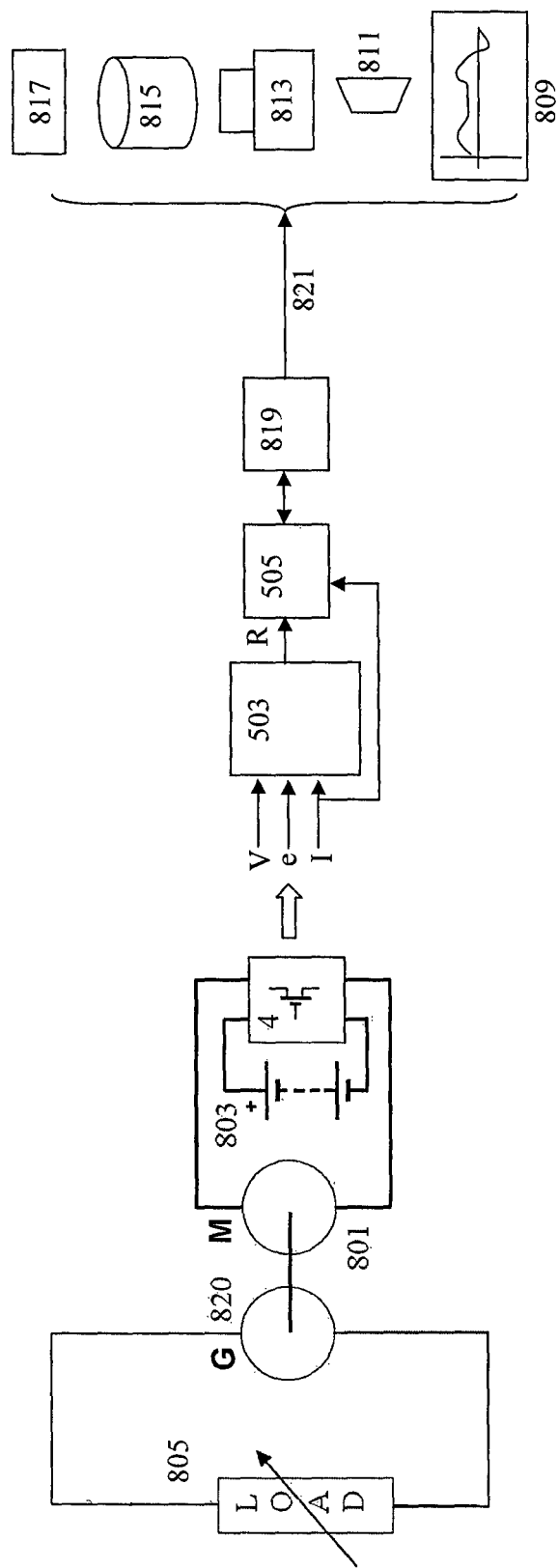

FIGS. 8A and 8B show further embodiments of the present invention in the form of block functional diagrams.

FIG. 8A shows a block functional diagram of a motor performance monitoring system which is arranged to monitor the types of motors described above. FIG. 8A shows a profile development logic module 503 as described above, which receives terminal voltage (V), back EMF (e) and load current (I) signals from a switching bridge and motor 801 being tested. The motor 801 is driven by a power supply 803 and switching bridge 4 and loaded by a generator 820 and a load 805. According to this embodiment, the load is a variable resistive load to enable the motor to be tested under different load conditions. It will be understood that different loads may be used to test the motor.

According to this embodiment, the load is adjusted manually to drive the motor into a range of different load conditions. This enables motor performance characteristics to be developed for different load currents. Alternatively, the load 805 may be adjusted automatically using a control system that is arranged to vary the load applied to the motor.

It will also be understood that the power supply 803 may be a fixed power supply or a variable power supply. Again, the power supply may be varied manually or through a control system that is arranged to adjust the power supply output.

The V, e and I values obtained from the switching bridge and motor under test are used to develop a motor performance parameter (R) as described above. The motor performance parameter R is communicated to a monitoring module 807. The monitoring module 807 also receives the load current (I) signal as a further input. The monitoring module 807 is also in communication with the storage module 505, which as described above stores R values of the motor for a set of load current (I) values. For example, the R and I values may be stored as a look up table, best fit equation or in any other suitable format which enables a profile to be stored and its associated values to be retrieved.

According to this embodiment, the R and I values are stored in the storage module as a benchmark profile. That is, the profile stored of R vs I is a preferred, ideal or expected R/I profile that the majority of motors of the type being monitored should exhibit. The benchmark profile may be created by testing a number of motors to develop a number of profiles and then taking the average of those profiles to create the benchmark profile. Alternatively, the benchmark profile may be developed based on a set of desired motor performance characteristics related to a desired quality of motor performance.

The monitoring module receives an R value from the profile development logic module for a specific load current that is applied to the motor being tested. This same load current is used by the monitoring module to retrieve the expected R value from the storage module. That is, the monitoring module compares the actual R value from the motor under test with the benchmark profile to compare the desired R value from the profile for the specific load current used in the test with the actual measured R value. The monitoring module 807 detects whether there is a difference between the actual R value and the desired R value from the benchmark profile and provides an output accordingly.

The output 808 of the monitoring module may be in one or more of a number of different forms (809, 811, 813, 815, 817).

For example, the output may be a simple indication showing the numerical or percentage difference between the actual and benchmark R values.

According to a further example, the monitoring module may determine the difference between the measured and benchmark R values and output a signal based on whether the difference is above or below a defined threshold value.

The output signal may identify one or more of: a motor performance parameter value; a load current applied to the motor; an error value based on the determined difference; the threshold value; the benchmark profile; data identifying the motor being monitored; data identifying when the benchmark profile was created; data identifying when the motor was monitored.

The output signal may be in the form of an audio and/or visual signal.

The audio signal (811) may be, for example, an alarm signal that is output from an audio output, such as a speaker for example. Alternatively, a recorded warning signal may be output indicating that the threshold has been reached or exceeded, for example.

The visual signal (809, 813) may be in the form of a visual report, chart, table or graph that identifies one or more of the measured, benchmark and/or difference values. Also, the visual signal may be a flashing light, coloured light, or displayed worded message to indicate the threshold has or has not been exceeded, or is close to being reached.

The visual signals in the form of a visual report, chart, table or graph may, for example, be printed out on a printer (813), displayed on a display device (809), communicated to an external device (817) for later retrieval, or stored in a storage module (815), such as a database, for example.

The motors may be monitored remote from the mobility vehicle, i.e. after they have been detached from the mobility vehicle, such as, for example, after the motor has been manufactured or assembled, or after it has been removed from the mobility vehicle due to a reported fault. Alternatively, the motor may be monitored while it is attached to the mobility vehicle, for example, to allow the motor to be tested while the mobility vehicle is being serviced.

FIG. 8B shows a block functional diagram of a motor performance monitoring system which is arranged to monitor the types of motors described above. FIG. 8B shows a profile development logic module 503 as described above, which receives terminal voltage (V), back EMF (e) and load current (I) signals from a switching bridge 4 and motor 801 being tested. The motor 801 is driven by a power supply 803 and switching bridge 4 and loaded by a generator 820 and a load 805. According to this embodiment, the load is a variable resistive load to enable the motor to be tested under different load conditions. It will be understood that different loads may be used to test the motor.

According to this embodiment, the load is adjusted manually to drive the motor into a range of different load conditions. This enables motor performance characteristics to be developed for different load currents. Alternatively, the load 805 may be adjusted automatically using a control system that is arranged to vary the load applied to the motor.

It will also be understood that the power supply 803 may be a fixed power supply or a variable power supply. Again, the power supply may be varied manually or through a control system that is arranged to adjust the power supply output.

The V, e and I values obtained from the switching bridge and motor under test are used to develop a motor performance parameter (R) as described above. The motor performance parameter R is communicated to a storage module 505 along with the load current value. The storage module stores the profile of the motor as described above for specific load current values over time.

A monitoring module 819 is in communication with the storage module 505, which as described above stores R values of the motor for a set of load current (I) values. For example, the R and I values may be stored as a look up table, best fit equation or in any other suitable format which enables a profile to be stored and its associated values to be retrieved.

According to this embodiment, the motor performance monitoring system is arranged to monitor the performance of one or more motor performance parameters of a motor under test over time. The test may be used to develop a benchmark profile for use in the earlier described embodiment. Also, the test may be used to develop quality control data for motors. For example, the test data may be used to determine the expected operating life for certain motor types. The operating life may be based on determining how long it takes for a developed motor performance parameter to change over time such that it falls outside of a desired operating threshold.

The monitoring module 819 monitors the stored profile values of the motor being tested. A set of rules are utilised by the monitoring module to determine whether the developed profile is varying above a defined threshold for the set test parameters. For example, the monitoring module may use a set of rules to detect how much the R value is varying over time for a preset load current. If the monitoring module detects that the R value has varied above a defined threshold value (an absolute value or percentage value, for example) before a set period of time has elapsed, an output is produced to indicate this finding. The output may be used to determine whether newly manufactured motors are within quality control thresholds.

Further, the above described system may be used to test motors that exhibit operating faults. For example, the motor may be tested by this monitoring system to determine whether the problem lies with the developed performance parameters of the motor.

It will be understood that the motor may also be tested under varying load conditions or power supply conditions in the same manner as described with reference to the embodiment shown in FIG. 8A.

It will be understood that the output 821 from the monitoring module of this embodiment may be the same as discussed with reference to the system described in FIG. 8A (809, 811, 813, 815, 817).

It will be understood that the embodiments of the present invention described herein are by way of example only, and that various changes and modifications may be made without departing from the scope of invention.

The invention claimed is:

1. A method of regulating the speed of at least one motor in a motorised mobility vehicle, wherein the motor is part of a drive circuit for mobilising the mobility vehicle, the method comprising:
   developing a resistance versus load current based profile of the motor based on at least one motor performance parameter,
   storing the developed profile,
   utilising the stored profile to develop a compensation term for controlling the motor power, and
   controlling the motor power to regulate the speed of the motor in the motorised mobility vehicle by dynamically updating the compensation term based on the stored profile, wherein dynamically updating the compensation term includes deriving a resistance of the motor from the stored profile based on a load current measured while the motorised mobility vehicle is being driven.

2. The method of claim 1, wherein the motor is one of: a permanent magnet motor; a shunt wound motor; a brushless DC motor; a DC brush motor.

3. The method of claim 1, wherein the compensation term is updated continuously.

4. The method of claim 1, further comprising dynamically updating the compensation term within a millisecond time frame.

5. The method of claim 1, further comprising constantly sensing the load current and dynamically updating the compensation term based on the sensed load current.

6. The method of claim 1, further comprising developing the load current in real time to generate a real time compensation term to be applied to a motor control circuit for the motor.

7. The method of claim 1, wherein the compensation term compensates for the resistance of the motor circuit.

8. The method of claim 7, wherein 100% of the compensation term is applied to the motor during all levels of motor loading.

9. The method of claim 7, wherein a portion of 100% of the compensation term is applied to the motor as the levels of motor loading vary.

10. The method of claim 9, wherein a reduced compensation term is applied as the motor loading increases.

11. The method of claim 7, wherein the stored profile is further shaped by speed.

12. The method of claim 7, wherein the compensation term is shaped by the stored profile.

13. The method of claim 7, wherein the compensation term is used to adjust the power applied to the motor.

14. The method of claim 1, further comprising applying the compensation term as a proportional control term.

15. The method of claim 1, further comprising applying the compensation term as an integral control term.

16. The method of claim 1, wherein the mobility vehicle is one of a power wheelchair and mobility scooter.

17. The method of claim 1, wherein the method controls two or more motors forming part of a differential steering mechanism of the mobility vehicle and each motor has a separate compensation term applied to it.

18. The method of claim 1, further comprising repeatedly updating the profile of the motor while the motor is in motion.

19. The method of claim 18, further comprising updating the profile of the motor based on a back EMF method.

20. The method of claim 19, wherein the back EMF method comprises developing the compensation term based on the developed load current.

21. The method of claim 19, wherein the back EMF sampling method comprises:
   developing the terminal voltage across the motor, the load current and the back EMF, and
   developing the compensation term based on the developed terminal voltage, load current and back EMF.

22. The method of claim 21, wherein the back EMF is developed after the motor is turned off for a period of time.

23. The method of claim 22, wherein the period of time is pre-determined or based on a stored algorithm.

24. The method of claim 18, further comprising determining whether the motor is being operated under a high load, and upon a positive determination, not updating the profile.

25. The method of claim 18, further comprising updating the profile of the motor during servicing or repair of the mobility vehicle.

26. The method of claim 18, further comprising updating the profile of the motor during normal use of the mobility vehicle.

27. The method of claim 26, further comprising updating the profile of the motor during normal use of the mobility vehicle without affecting the operation of the motor during the update.

28. The method of claim 1, further comprising:
   monitoring the resistance versus load current based profile,
   predicting an operation scenario based on the monitoring step, and
   providing an output based on the predicted operation scenario.

29. The method of claim 28, further comprising:
   detecting a predefined increase in a performance parameter of the motor based on the monitoring of the profile.

30. The method of claim 28, further comprising:
   detecting a trend in a performance parameter of the motor based on the monitoring of the profile.

31. The method of claim 28, further comprising:
   detecting a performance parameter of the motor has exceeded a predefined threshold value based on the monitoring of the profile.

32. The method of claim 28, further comprising the output limiting power to the motor.

33. The method of claim 32, wherein the power to the motor is limited by adjusting a limiting term applied to a control system for controlling the operation of the motor.

34. The method of claim 28, further comprising the output creating an audible or visible signal.

35. The method of claim 28, further comprising the output indicating when a service for the mobility vehicle is due.

36. The method of claim 28, further comprising the output providing a warning signal.

37. The method of claim 28, further comprising the output providing a fault indication.

38. The method of claim 28, wherein the mobility vehicle is one of a power wheelchair and mobility scooter.

39. The method of claim 28, wherein the motor is one of: a permanent magnet motor; a shunt wound motor; a brushless DC motor; a brush DC motor.

40. A control system in a motorised mobility vehicle, the control system arranged to regulate the speed of at least one motor wherein the motor is part of a drive circuit for mobilising the mobility vehicle, the control system comprising:
   a profile development module arranged to develop a resistance versus load current based profile of the motor based on at least one motor performance parameter,
   a storage module arranged to store the developed profile,
   a compensation term development module arranged to:

utilise a stored profile to develop a compensation term for controlling the motor power, and dynamically update the compensation term, wherein dynamically updating the compensation term includes deriving a resistance of the motor from the stored profile based on a load current measured while the motorised mobility vehicle is being driven, and a control module arranged to control the motor power to regulate the speed of the motor in the motorised mobility vehicle based on the dynamically updated compensation term while the motorised mobility vehicle is being driven.

41. The system of claim 40, further comprising:

a profile monitoring module arranged to monitor the resistance versus load current based profile, a scenario prediction module arranged to predict an operation scenario based on the monitoring, and an output module arranged to provide an output based on the predicted operation scenario.

42. A method of regulating the speed of at least one motor in a motorised mobility vehicle, wherein the motor is part of a drive circuit for mobilising the mobility vehicle, the method comprising:

developing at least one motor performance parameter of the motor, developing a resistance versus load current based profile of the motor based on the developed motor performance parameter, storing the developed profile, and controlling the motor power to regulate the speed of the motor in the motorised mobility vehicle by dynamically updating a compensation term based on the stored profile and applying the compensation term to control the motor power, wherein dynamically updating the compensation term includes deriving a resistance of the motor from the stored profile based on a load current measured while the motorised mobility vehicle is being driven.

43. The method of claim 42, further comprising repeatedly updating the profile.

44. The method of claim 43, further comprising updating the profile after determining that the motor temperature has changed or after a pre-determined operating period.

45. The method of claim 43, further comprising updating the profile after a pre-determined operating period.

46. The method of claim 42, further comprising developing an initial profile during assembly or commissioning of the vehicle.

47. The method of claim 42, further comprising developing the motor performance parameter to create an instantaneous profile of the motor.

48. The method of claim 42, further comprising storing the profile as a look up table or a set of polynomial values.

49. The method of claim 42, wherein the motor performance parameter is an electrical resistance of the motor, and the profile provides a resistance value for the measured load current.

50. The method of claim 49, wherein the profile is developed for load currents based on forward and reverse driving current values.

51. The method of claim 49, wherein the profile is developed for load currents based on forward driving current values only, and load currents for reverse driving current values are developed by mirroring the load currents based on the forward driving current values.

52. The method of claim 49, wherein the profile is developed for a range of operating load currents.

53. The method of claim 42, wherein the profile is developed for each of four control quadrants of the motor.

54. The method of claim 42, wherein the profile is developed in a first control quadrant of the motor, and subsequently used to control the motor in all four control quadrants of the motor.

55. The method of claim 42, wherein the motor performance parameter is developed based on motor current, driven terminal voltage and back EMF.

56. The method of claim 55, wherein the motor current and driven terminal voltage are developed prior to developing the back EMF of the motor.

57. The method of claim 55, wherein, when the driven terminal voltage is a PWM signal, the PWM signal is filtered to develop the motor characteristic.

58. The method of claim 55, wherein, when a signal representing the driven terminal voltage is a PWM signal, the motor characteristic is developed by calculating the mean driven terminal voltage based on the mean peak voltage and PWM ratio of the signal.

59. The method of claim 55, wherein the motor performance parameter further comprises a resistance calculation of the motor based on the motor current, driven terminal voltage and back EMF.

60. The method of claim 55, wherein the development of the motor performance parameter is repeated at various motor current values to develop a full profile.

61. The method of claim 60, wherein the values developed in claim 50 are interpolated to complete the profile of the full current range of the motor.

62. The method of claim 60, wherein the values developed in claim 50 are applied to a best fit equation to complete the profile.

63. The method of claim 42, wherein the motor performance parameter is further developed as a function of motor speed and/or motor age.

64. The method of claim 42, wherein the motor performance parameter is further developed as a function of motor age.

65. The method of claim 42, further comprising determining whether the profile is outside the limits of a predetermined threshold, and, upon a positive determination, developing a warning signal.

66. The method of claim 65, wherein the developed warning signal is provided to a user of the mobility vehicle during use.

67. The method of claim 65, wherein the developed warning signal is provided to a service entity during service of the mobility vehicle.

68. The method of claim 65, wherein the developed warning signal is used to limit the power being applied to the motor.

69. The method of claim 42, further comprising storing the profile in a memory.

70. The method of claim 69, wherein trends in the profile are provided to a service entity during service of the mobility vehicle.

71. A control system in a motorised mobility vehicle, the control system arranged to control regulate the speed of at least one motor, wherein the motor is part of a drive circuit for mobilising the mobility vehicle, the control system comprising;

a motor performance parameter development module arranged to develop at least one motor performance parameter of the motor, a profile development module arranged to develop a resistance versus load current based profile of the motor based on the developed motor performance parameter, a storage module arranged to store the developed profile, and a control module arranged to control the motor power to regulate the speed of the motor in the motorised mobility vehicle by dynamically updating a compensation term based on the stored profile and applying the compensation term to control the motor power, wherein dynamically updating the compensation term includes deriving a resistance of the motor from the stored profile based on a load current measured while the motorised mobility vehicle is being driven.

* * * * *